(12) United States Patent
Shibata

(10) Patent No.: US 7,262,490 B2
(45) Date of Patent: Aug. 28, 2007

(54) SEMICONDUCTOR CHIP WITH EXTERNAL CONNECTING TERMINAL

(75) Inventor: Kazutaka Shibata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 11/053,892

(22) Filed: Feb. 10, 2005

(65) Prior Publication Data

US 2005/0146055 A1  Jul. 7, 2005

Related U.S. Application Data

(62) Division of application No. 09/588,628, filed on Jun. 7, 2000, now Pat. No. 6,870,248.

(30) Foreign Application Priority Data

Jun. 7, 1999 (JP) ............................. 11-160066
Aug. 31, 1999 (JP) ............................. 11-245854

(51) Int. Cl.
  *H01L 23/495* (2006.01)
(52) U.S. Cl. .................................... 257/666
(58) Field of Classification Search ........ 257/666–769, 257/E33.066, E23.141
  See application file for complete search history.

(56) References Cited

U.S. PATENT DOCUMENTS

| | | | |
|---|---|---|---|
| 4,825,284 A | | 4/1989 | Soga et al. |
| 5,172,214 A | * | 12/1992 | Casto ........................ 257/676 |
| 5,450,283 A | | 9/1995 | Lin et al. |
| 5,822,190 A | * | 10/1998 | Iwasaki ...................... 361/737 |
| 5,844,304 A | | 12/1998 | Kata |
| 5,959,462 A | | 9/1999 | Lum |
| 5,977,640 A | | 11/1999 | Bertin et al. |
| 6,060,768 A | * | 5/2000 | Hayashida et al. ......... 257/666 |
| 6,075,284 A | * | 6/2000 | Choi et al. .................. 257/676 |
| 6,188,580 B1 | | 2/2001 | Huber et al. |
| 6,194,247 B1 | | 2/2001 | Burns et al. |
| 6,204,564 B1 | | 3/2001 | Miyata |
| 6,207,473 B1 | | 3/2001 | Hirai |
| 6,232,213 B1 | * | 5/2001 | King et al. ................. 438/613 |
| 6,239,366 B1 | | 5/2001 | Hsuan et al. |
| 6,239,367 B1 | | 5/2001 | Hsuan et al. |
| 6,239,484 B1 | | 5/2001 | Dore et al. |
| 6,242,797 B1 | * | 6/2001 | Ichikawa et al. ........... 257/666 |

(Continued)

FOREIGN PATENT DOCUMENTS

EP    0 917 191 A2    5/1999

(Continued)

OTHER PUBLICATIONS

Japanese Patent Office, Office Action, May 20, 2003 (Applicant's unique citation designation number —CA).

*Primary Examiner*—Nathan W. Ha
(74) *Attorney, Agent, or Firm*—Rabin & Berdo, PC

(57) ABSTRACT

A semiconductor device having a semiconductor chip and protective resin covering a sidewall of the semiconductor chip and having a surface formed so as to be flush with an inactive surface of the semiconductor chip. The semiconductor chip may be joined to a wiring board or another semiconductor chip. The semiconductor device may further include an external connecting terminal having an exposed portion exposed to the outside of the protective resin.

4 Claims, 9 Drawing Sheets

U.S. PATENT DOCUMENTS

| | | |
|---|---|---|
| 6,246,010 B1 | 6/2001 | Zenner et al. |
| 6,256,207 B1 | 7/2001 | Horiuchi |
| 6,323,551 B1 * | 11/2001 | Anzai ................. 257/737 |
| 6,376,915 B1 | 4/2002 | Hikita et al. |
| 6,448,665 B1 | 9/2002 | Nakazawa et al. |
| 6,451,628 B1 | 9/2002 | Tani et al. |
| 6,459,152 B1 | 10/2002 | Tomita et al. |
| 6,489,667 B1 | 12/2002 | Shim et al. |
| 6,518,662 B1 | 2/2003 | Smith et al. |
| 6,700,187 B2 | 3/2004 | Paek |
| 2003/0207572 A1 | 11/2003 | Yoshinori et al. |
| 2004/0150081 A1 | 8/2004 | Ogawa |
| 2004/0237327 A1 | 12/2004 | Okabe et al. |

FOREIGN PATENT DOCUMENTS

| | | |
|---|---|---|
| JP | 02-031437 A1 | 2/1990 |
| JP | 05-259274 A | 2/1992 |
| JP | 05-003183 | 1/1993 |
| JP | 05-55278 A1 | 3/1993 |
| JP | 9-153507 | 6/1997 |
| JP | 09-153507 A1 | 6/1997 |
| JP | 10-107095 A1 | 4/1998 |
| JP | 11-150090 | 6/1999 |
| JP | 2001-060591 | 3/2001 |
| JP | 2001-060658 | 3/2001 |
| JP | 2001-085453 | 3/2001 |
| JP | 2001-127206 | 5/2001 |
| JP | 2001-339011 | 12/2001 |

* cited by examiner

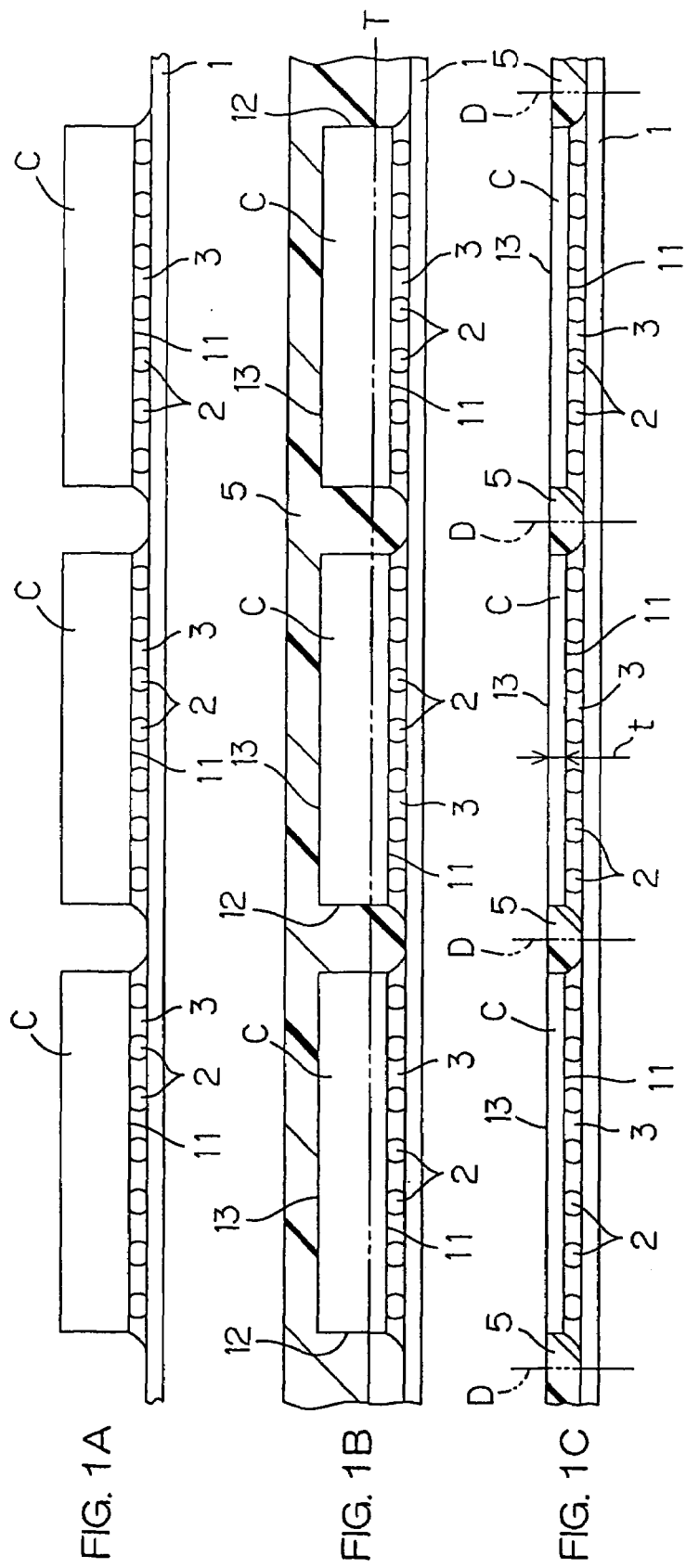
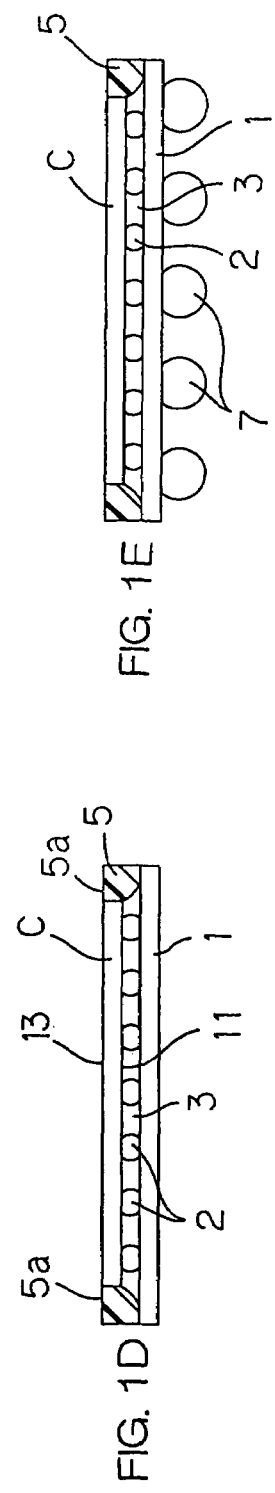
FIG. 1A
FIG. 1B
FIG. 1C
FIG. 1D
FIG. 1E

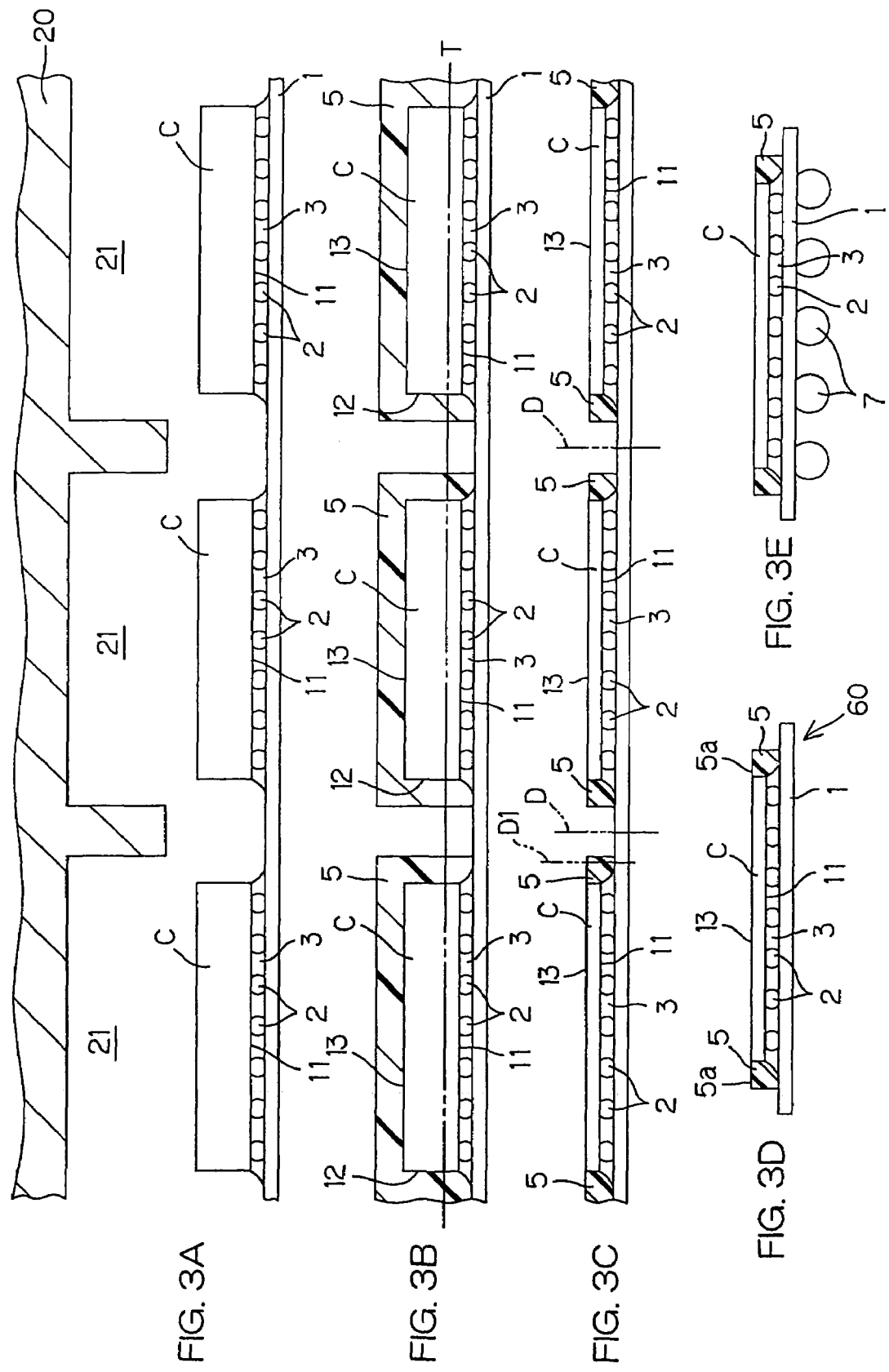

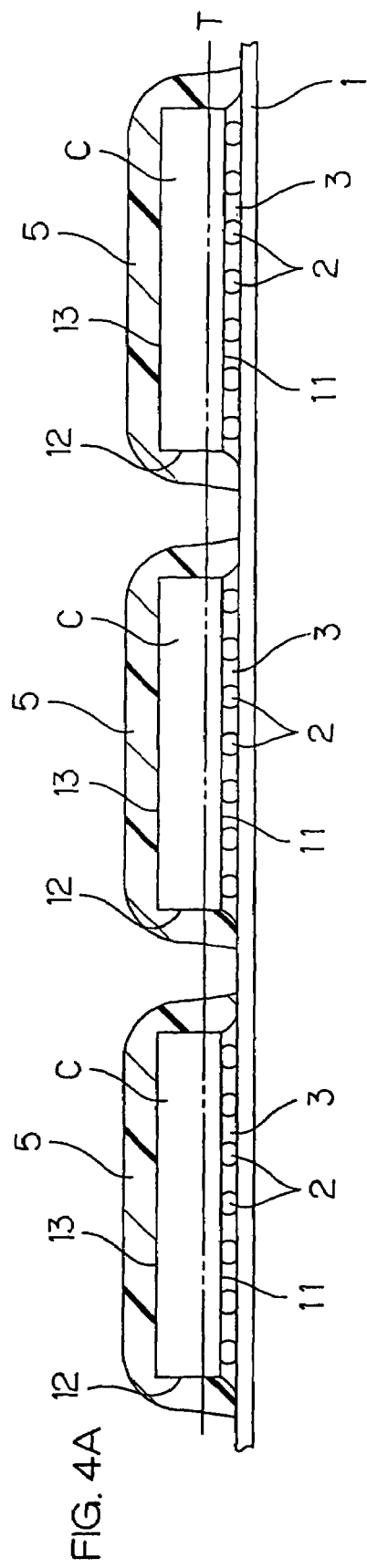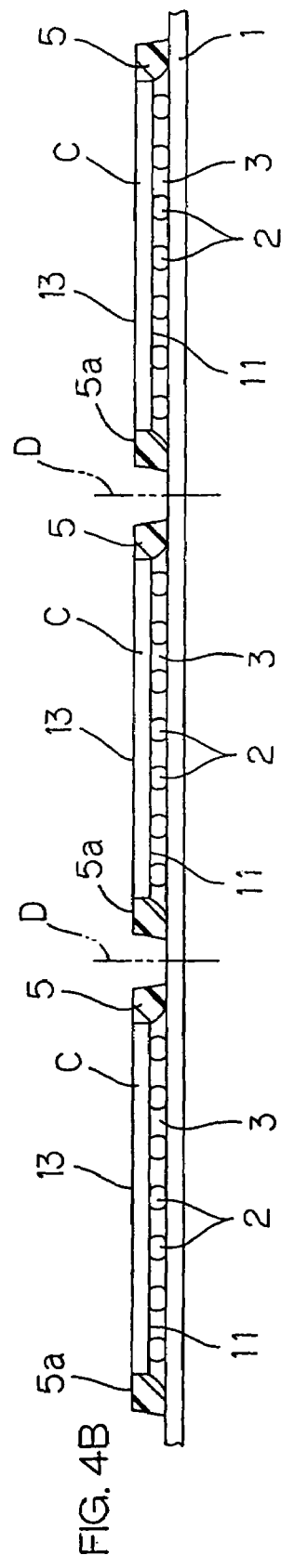

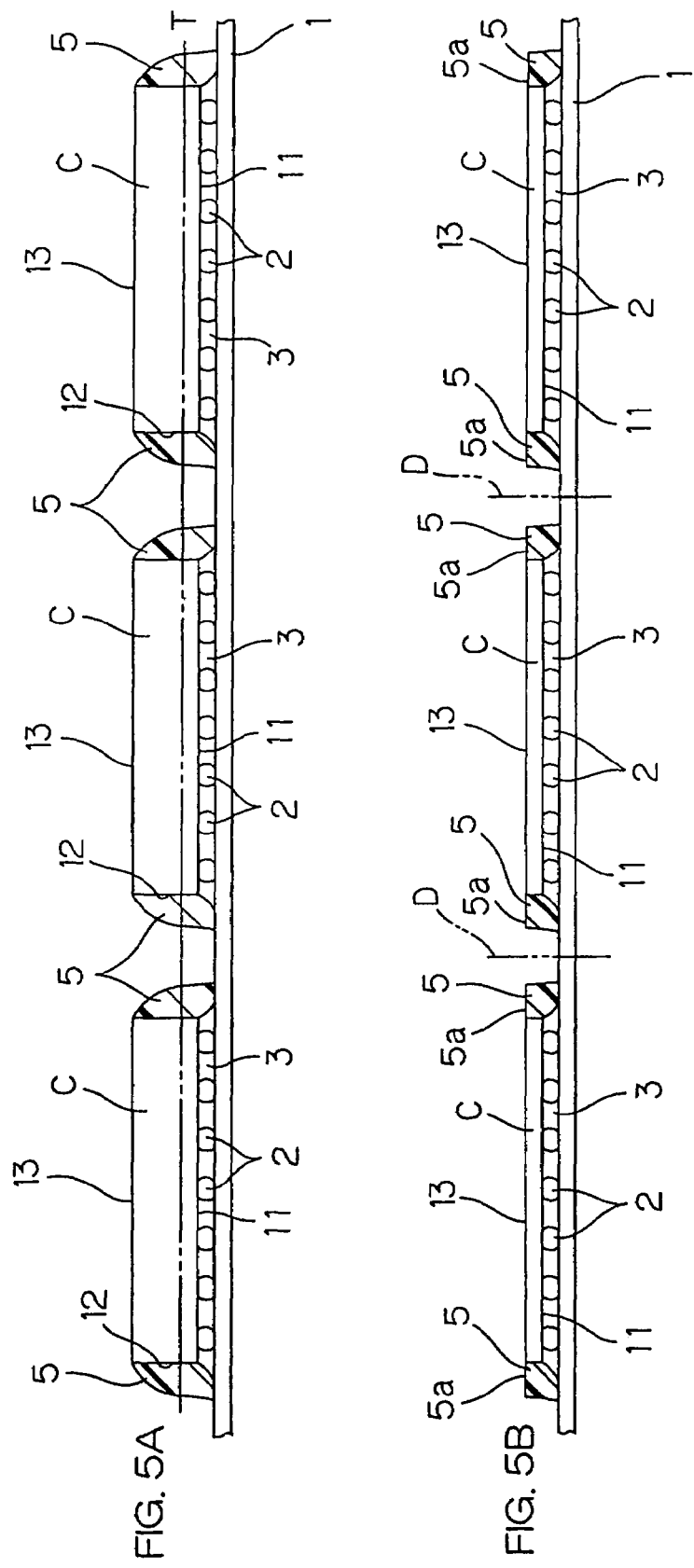

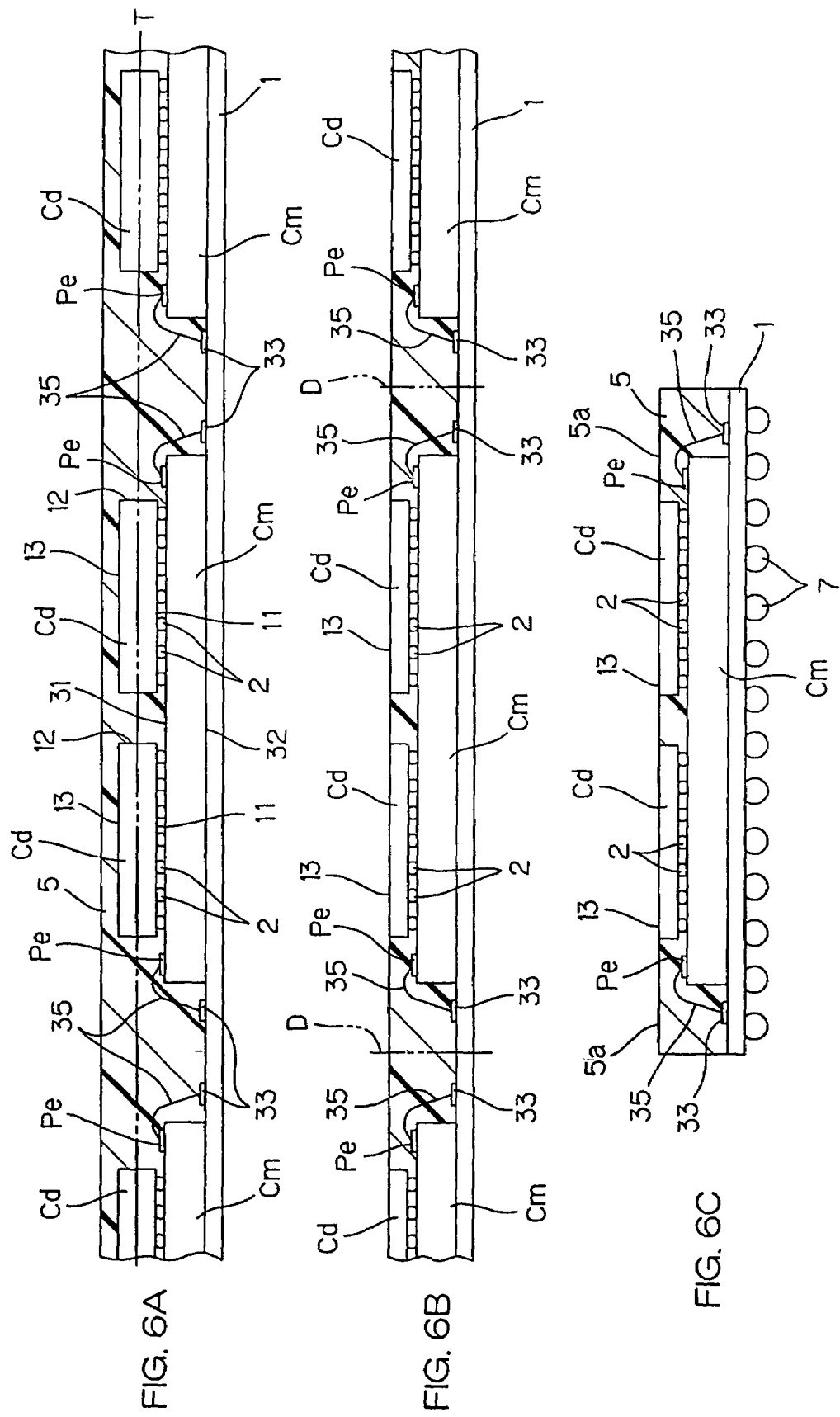

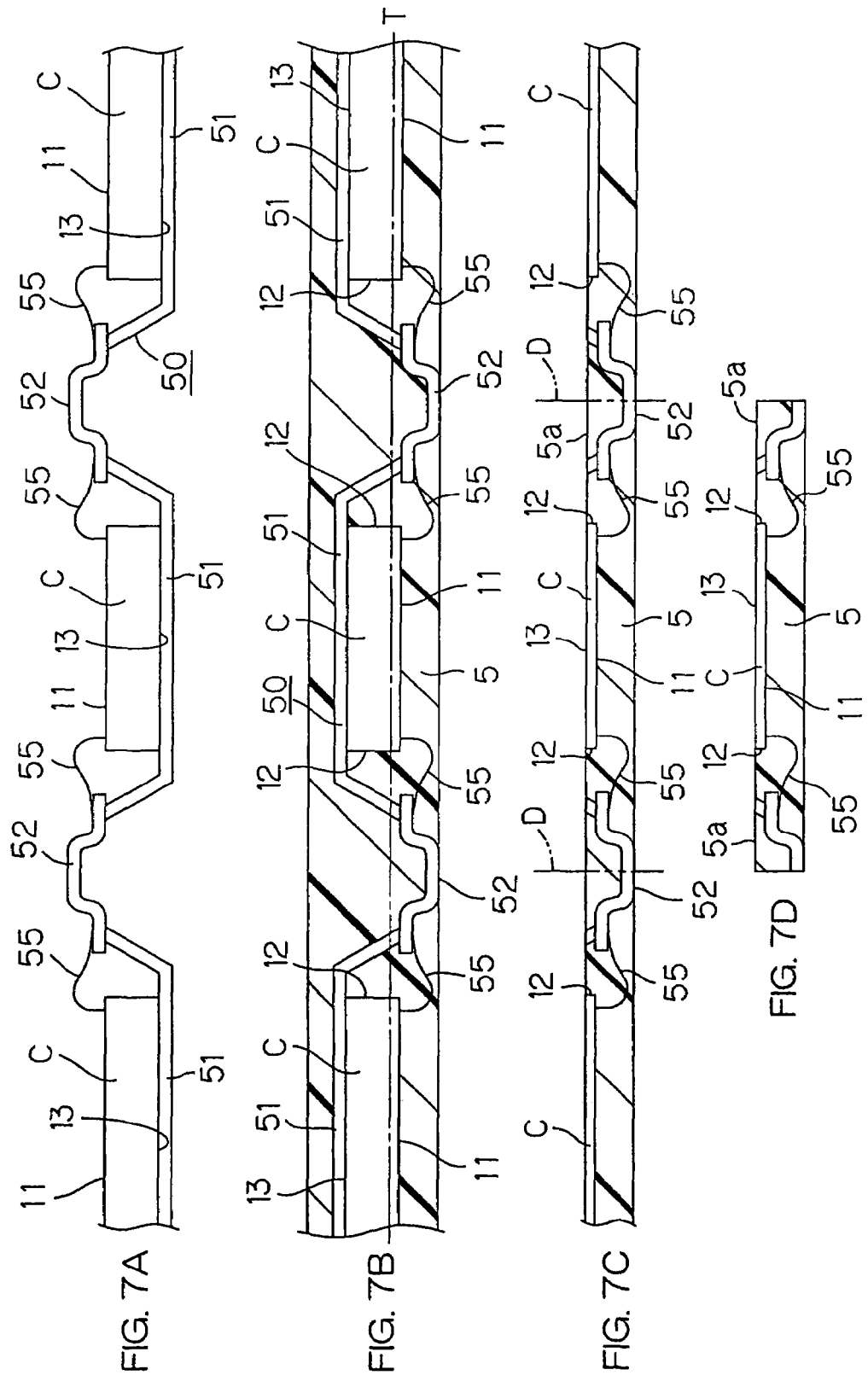

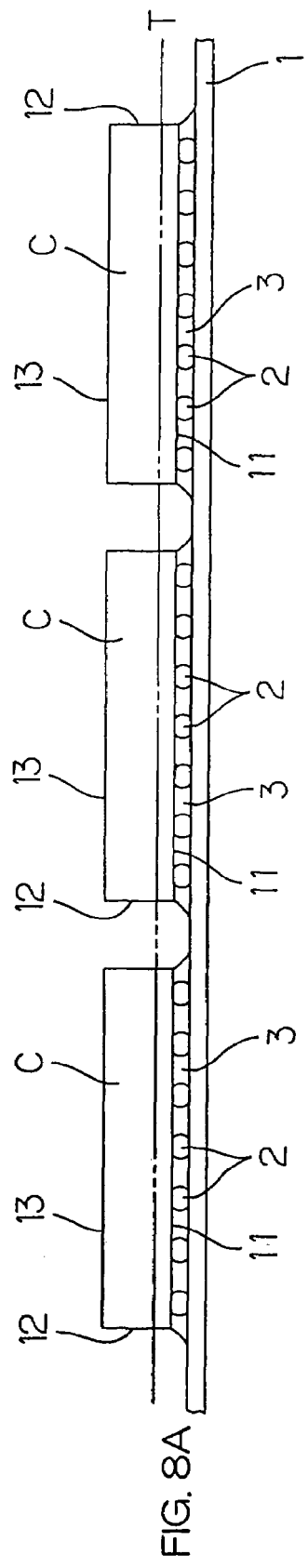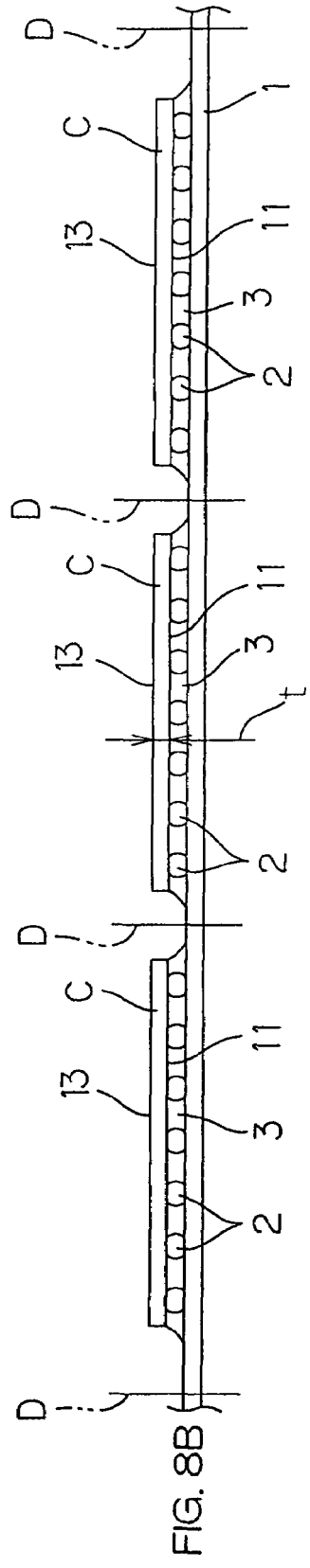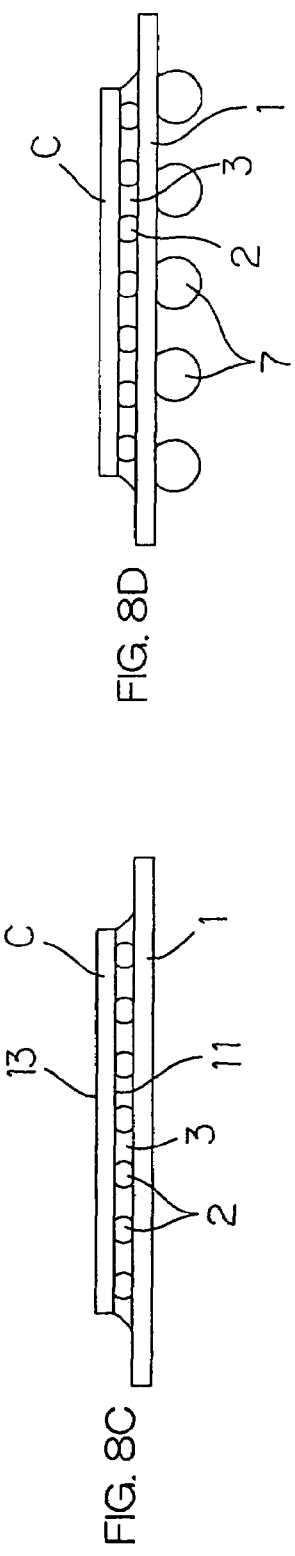

SEMICONDUCTOR CHIP WITH EXTERNAL CONNECTING TERMINAL

This is a Divisional of U.S. application Ser. No.: 09/588,628, filed Jun. 7, 2000 now U.S. Pat. No. 6,870,248, the subject matter of which is incorporated herein by reference.

BACKGROUND OF THE INVENTION

1. Field of the Invention

The present invention relates to a semiconductor device particularly favorable for thinning thereof and a method of producing the same.

2. Description of Related Art

A typical step of assembling a semiconductor device involves the steps of dicing a semiconductor wafer to produce individual semiconductor chips, die-bonding the semiconductor chip to a lead frame, wire-bonding a pad of the semiconductor chip and the lead frame, and resin-molding a lead in a state where it is pulled out to the outside.

In order to thin the whole of the semiconductor device, the semiconductor chip itself must be thinned. Therefore, prior to dicing the semiconductor wafer, a grinding step for grinding an inactive surface (a back surface) of the wafer using a grinder is carried out. The wafer which has been thinned to a predetermined thickness is then diced, so that individual semiconductor chips are cut out.

When the thin semiconductor wafer is divided by a dicing saw, however, the wafer is cracked, and the chip is chipped. Therefore, the thinning of the wafer before the dicing has a limit.

In recent years, a method of first dicing the water and then, grinding the back surface of the wafer has been proposed. Specifically, an inactive surface 102 of a wafer 100 is bonded to a dicing tape 105 in a state where an active surface 101 of the wafer 100 is exposed, as shown in FIG. 9A. In this state, a half-cut step for providing the wafer 100 with cutting grooves 103 to a depth of approximately 50 μm from the active surface 101 is carried out using a dicing saw 107. Subsequently to the half-cut step, the dicing tape 105 on the inactive surface 102 is stripped, and a dicing tape 106 is affixed to the active surface 101, as shown in FIG. 9B. In this state, the grinding of the inactive surface 102, that is, back surface grinding is performed using a grinder 109. The back surface grinding is performed until the inactive surface 102 reaches the cutting grooves 103. When the cutting grooves 103 appear by the back surface grinding, individual semiconductor chips 110 having a thickness of approximately 50 μm are obtained (FIG. 9C).

The semiconductor chips 110 which have been thinned can be thus produced without cracking or chipping at the time of dicing.

The semiconductor chips thus produced are thereafter carried on a mounting board. Further, a semiconductor device (an integrated circuit device) is completed through steps such as connection of an external terminal and resin molding.

However, the semiconductor chips 110 which have been thinned may be cracked or chipped at the time of handling. For example, the semiconductor chips 110 are carried on the mounting board automatically by a robot. The thin semiconductor chips 110 are cracked or the corners thereof are easily chipped by an external force applied when they are held by the hands of the robot.

Consequently, the above-mentioned prior art can prevent chips from being cracked or chipped at the time of dicing, while causing a new problem such as cracking or chipping at the time of handling.

SUMMARY OF THE INVENTION

An object of the present invention is to provide a semiconductor device which can be produced without cracking or chipping a semiconductor chip.

Another object of the present invention is to provide a method of producing a semiconductor device without cracking or chipping a semiconductor chip.

A semiconductor device according to the present invention comprises, in a first aspect, a semiconductor chip; and protective resin covering a sidewall of the semiconductor chip and having a surface formed so as to be flush with an inactive surface which is a surface on the opposite side of an active surface of the semiconductor chip.

According to the above-mentioned construction, the sidewall of the semiconductor chip is covered with the protective resin. The protective resin has the surface formed so as to be flush with the inactive surface of the semiconductor chip.

The semiconductor chip can be produced by a producing method comprising a resin sealing step for sealing a semiconductor chip with protective resin covering at least a sidewall of the semiconductor chip; and a grinding step for simultaneously grinding or polishing an inactive surface which is a surface on the opposite side of an active surface of the semiconductor chip and the protective resin covering the sidewall of the semiconductor chip.

It is preferable that the semiconductor device further comprises an external connecting terminal electrically connected to the active surface of the semiconductor chip and having an exposed portion exposed to the outside of the protective resin.

In this case, the external connecting terminal may be a ball-shaped terminal such as a solder ball joined to the wiring board, or a lead frame electrically connected to the semiconductor chip through a bonding wire.

The semiconductor device may further comprise a board to which the semiconductor chip is joined.

The semiconductor device of this construction can be produced by a producing method further comprising a chip joining step for joining the semiconductor chip to the board before the resin sealing step.

In this case, the semiconductor chip may be joined to the board in a state where the active surface is opposite to the board. In this case, in the chip joining step, the semiconductor chip is joined to the board in a state where its active surface is opposite to the board. In the case of this construction, the semiconductor chip is joined to the board by so-called face-down bonding. Consequently, the active surface of the semiconductor chip is protected by the board.

The board may be a lead frame. In this case, it is preferable that in the chip joining step, the semiconductor chip is joined to the lead frame in a state where its inactive surface is opposite to the lead frame. It is preferable that a connecting step for connecting, with a bonding wire, a predetermined portion of the lead frame and a predetermined portion of an active surface of the semiconductor chip is further carried out before the resin sealing step. It is preferable that in the resin sealing step, the active surface of the semiconductor chip and the bonding wire are together sealed with resin. Further, it is preferable that in the grinding step, a portion, positioned on the side of the inactive surface, of the lead frame is ground prior to the grinding of the inactive surface of the semiconductor chip. In this case, the active surface of the semiconductor chip is protected by the protective resin.

For example, in the chip joining step, individual semiconductor chips obtained by dicing a relatively thick semiconductor wafer (for example, 300 to 700 µm thick) are joined to the board. It is easy to thus cut out the individual semiconductor chips from the thick semiconductor wafer, so that the semiconductor chips are not cracked or chipped. The thick semiconductor chip taken out of the thick semiconductor wafer is not cracked or chipped in the case of handling using a robot or the like.

The semiconductor chip is sealed with the protective resin, and the protective resin and the inactive surface of the semiconductor chip are simultaneously ground, thereby making it possible to make the inactive surface of the semiconductor chip and the surface of the protective resin flush with each other. In the case of the grinding, the semiconductor chip is ground in a state where the periphery thereof is protected by the protective resin, so that the semiconductor chip may not be cracked or chipped. In such a manner, the thickness of the semiconductor chip can be decreased.

In the semiconductor device thus obtained, the sidewall of the semiconductor chip is covered with the protective resin, and all corners of the semiconductor chip are protected by the protective resin. Even if the semiconductor chip is significantly thinned (for example, 100 to 200 µm) by grinding, the semiconductor chip may not be damaged.

Specifically, even if the semiconductor device is mounted on a printed wiring board or the like using the robot, the semiconductor chip may not be cracked or chipped.

In the chip joining step, a plurality of semiconductor chips may be joined to board. In this case, it is preferable that the plurality of semiconductor chips on the board are sealed with resin in the resin sealing step, the plurality of semiconductor chips are concurrently subjected to the grinding step, and a cutting step for cutting out individual pieces of semiconductor devices each including the predetermined number of semiconductor chips is further carried out after the grinding step.

Consequently, it is possible to collectively produce a plurality of semiconductor devices.

In this case, the plurality of semiconductor chips may be individually sealed with resin. Alternatively, they may be collectively sealed with resin. When the plurality of semiconductor chips are collectively sealed with resin, the cutting step may include the step of simultaneously cutting the protective resin and the board.

The board may be a wiring board having a wiring pattern formed therein. Alternatively, the board may be another semiconductor chip, to constitute a semiconductor device having a chip-on-chip structure as a whole.

In a case where the chip-on-chip structure is employed, if a plurality of secondary chips are joined to a primary chip to be the base by face-down bonding, and the protective resin and inactive surface of the plurality of secondary chips are simultaneously ground, the heights of the surfaces of the secondary chips can be made uniform.

The semiconductor chips may be joined to the board through a bump such as a gold bump, for example.

A semiconductor device according to the present invention comprises, in a second aspect, a board; and a semiconductor chip joined to the board in a state where its active surface is opposite to the board and its inactive surface which is a surface on the opposite side of the active surface is exposed.

In this case, protective resin covering a sidewall of the board may be or may not be provided. In the form of a final product, the inactive surface of the board is not covered with the protective resin or the like and is exposed to the outside. However, it is possible to ignore the effect from the outside on devices formed in a surface layer area on the active surface opposite to the board. The active surface is protected by being opposed to the board. A portion between the active surface and the board is filled with a resin agent, as required. However, this is sufficient to protect the devices formed in the surface layer area on the active surface.

It is preferable that the semiconductor chip is thinned by grinding or polishing processing of the inactive surface (preferably thinned to a thickness of 100 µm to 200 µm).

The semiconductor device can be produced by a producing method comprising a chip joining step for joining a semiconductor chip to a board in a state where an active surface of the semiconductor chip is opposite to the board; and a grinding step for grinding or polishing an inactive surface which is a surface on the opposite side of the active surface of the semiconductor chip.

In this case, the semiconductor chip may be or may not be sealed with resin. The grinding step can be carried out without causing problems even if the semiconductor chip is not sealed with resin. If the resin sealing step is omitted, the producing steps are significantly simplified. Accordingly, it is possible to reduce the production cost and to improve the productivity.

In order to protect the active surface of the semiconductor chip, however, it is preferable to include the step of injecting a resin agent into a clearance between the active surface of the semiconductor chip and the board.

In the chip joining step, a plurality of semiconductor chips may be joined to the board, and the plurality of semiconductor chips may be concurrently subjected to the grinding step. In this case, it is preferable that a cutting step for cutting out individual pieces of semiconductor devices each including the predetermined number of semiconductor chips by cutting the board is further carried out after the grinding step.

Consequently, it is possible to collectively produce a plurality of semiconductor devices.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1A to 1E are cross-sectional views showing the steps of assembling a semiconductor device according to a first embodiment of the present invention;

FIGS. 3A to 3E are cross-sectional views showing the steps of assembling a semiconductor device according to a second embodiment of the present invention;

FIGS. 4A and 4B are cross-sectional views showing the steps of assembling a semiconductor device according to a third embodiment of the present invention;

FIGS. 5A and 5B are cross-sectional views showing the steps of assembling a semiconductor device according to a fourth embodiment of the present invention;

FIGS. 6A to 6C are cross-sectional views showing the steps of assembling a semiconductor device according to a fifth embodiment of the present invention;

FIGS. 7A to 7D are cross-sectional views showing the steps of assembling a semiconductor device according to a sixth embodiment of the present invention;

FIGS. 8A to 8D are cross-sectional views showing the steps of assembling a semiconductor device according to a seventh embodiment of the present invention.

DESCRIPTION OF THE PREFERRED EMBODIMENTS

Figure 2:
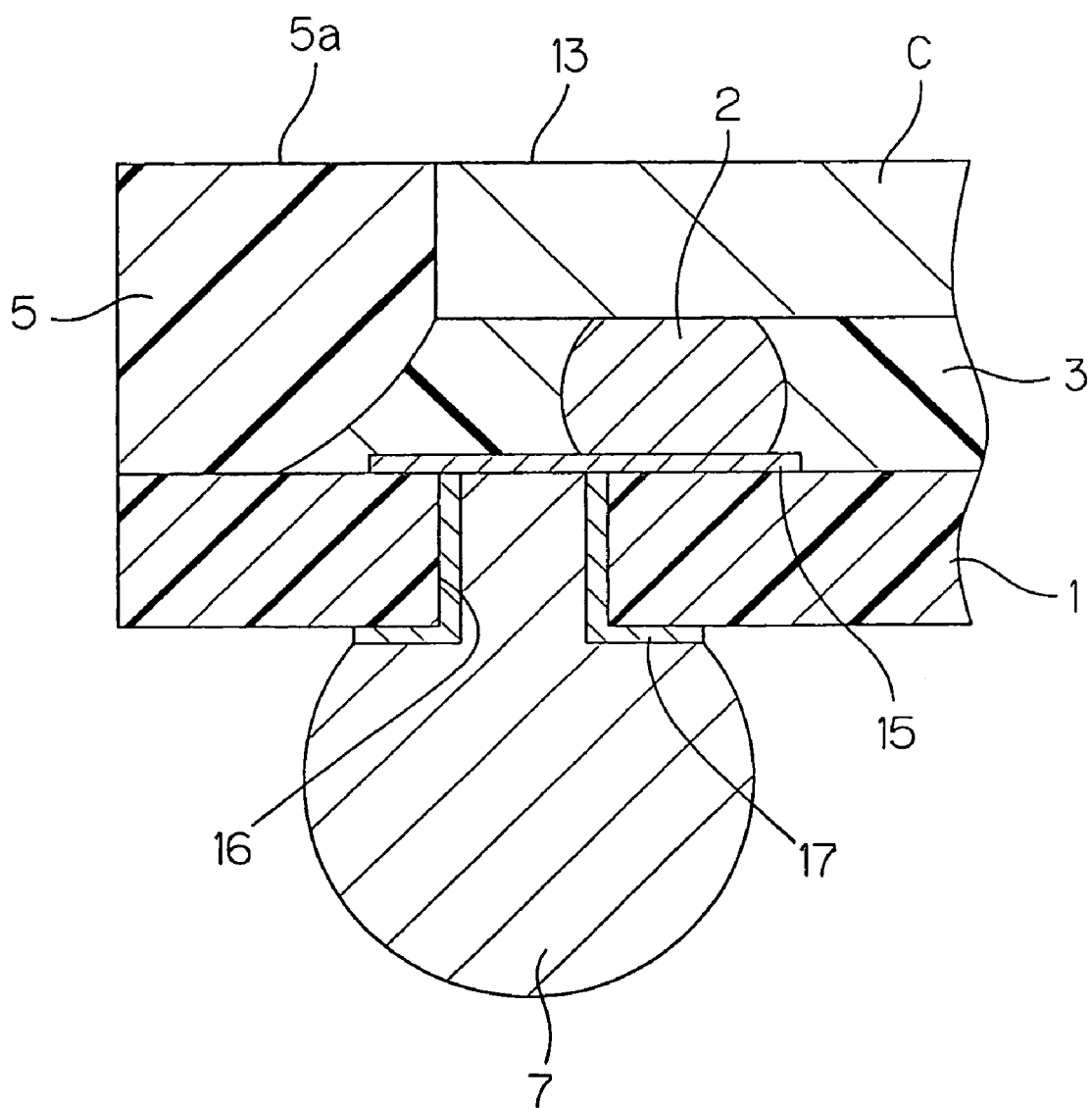
FIG. 2 is a cross-sectional view showing construction in the vicinity of a solder ball in enlarged fashion.
Figure 9A:
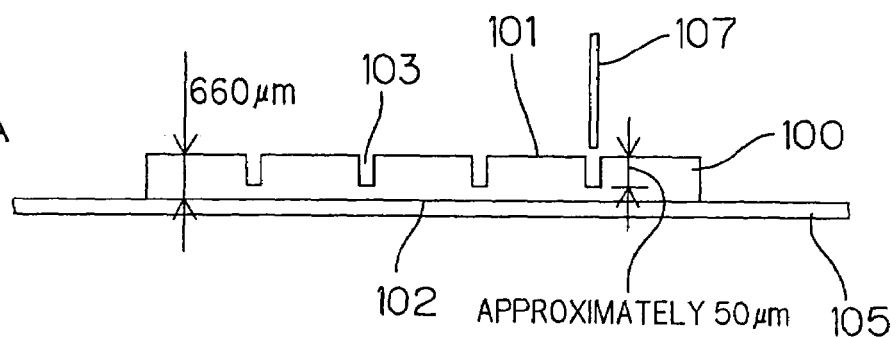
FIGS. 9A to 9C are cross-sectional views for explaining the steps of fabricating a thinned semiconductor device in the prior art.
Figure 9B:
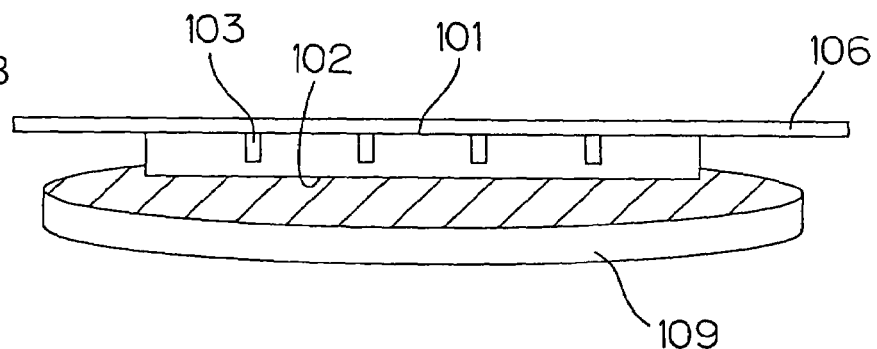
Figure 9C:
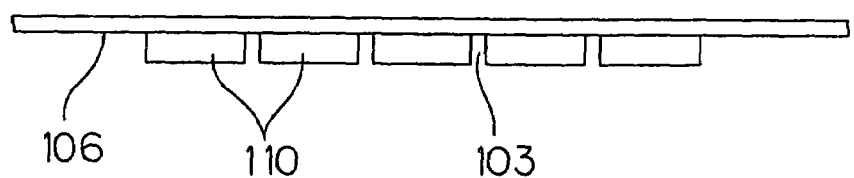

FIGS. 1A to 1E are cross-sectional views showing the steps of assembling a semiconductor device according to a first embodiment of the present invention. FIG. 1A illustrates a semiconductor chip joining step. A wiring pattern is previously formed by copper foil etching, for example, on a board 1 such as a board composed of polyimide. A plurality of semiconductor chips C are joined to the board 1 by face-down bonding. That is, the semiconductor chip C is joined to the board 1 through bumps 2 in a state where an active surface 11 which is a surface on the side of an active surface layer region where devices such as transistors and resistors are formed is opposite to the board 1, and is electrically connected to a wiring pattern formed in the board 1.

The semiconductor chip C joined to the board 1 has a relatively large thickness, for example, a thickness of approximately 300 to 700 μm. The semiconductor chip C is obtained by dividing a thick semiconductor wafer (not shown) having a thickness of 300 to 700 μm using a dicing saw. The sufficiently thick wafer is not cracked or chipped in the dicing step. Moreover, the thick semiconductor chip C obtained through the dicing step is not cracked or chipped even at the time of later handling for joining the semiconductor chip C to the board 1.

After the semiconductor chip C is joined to the board 1, liquid resin 3 (underfill) is injected into a clearance between the active surface 11 and the board 1, as required.

FIG. 1B illustrates a resin sealing step carried out subsequently to the semiconductor chip joining step. In the resin sealing step, a metal mold (not shown) having a cavity collectively containing the plurality of semiconductor chips C which are joined to the board 1 formed therein is used. The plurality of semiconductor chips C on the board 1 are collectively sealed with resin 5 using the metal mold. Consequently, a sidewall 12 of each of the semiconductor chips C and an inactive surface 13 on the opposite side of the active surface 11 are covered with the resin 5. Further, a side part of the clearance between the active surface 11 and the board 1 is sealed with the resin 5, thereby protecting the active surface 11.

FIG. 1C illustrates a grinding step carried out after curing the resin 5 subsequently to the resin sealing step. In the grinding step, grinding is performed to a target grinding thickness T indicated by a two-dot and dash line in FIG. 1B using a grinder. That is, the resin 5 is ground, so that the inactive surface 13 of the semiconductor chip C is exposed. Thereafter, the resin 5 and the inactive surface 13 of the semiconductor chip C are simultaneously ground to the target grinding thickness T. The target grinding thickness T is so set that the thickness t of the semiconductor chip C after the grinding is approximately 100 to 200 μm, for example.

The resin 5 and the board 1 are then cut along cutting lines D set between the semiconductor chips C using a dicing saw, for example. Accordingly, individual pieces of semiconductor devices are cut out, as shown in FIG. 1D. In the semiconductor device obtained by the cutting step, the sidewall of the semiconductor chip C is covered with the resin 5 over the entire periphery thereof. An upper surface 5a of the resin 5 and the inactive surface 13 after the grinding are flush with each other, and the corners of the semiconductor chip C are covered with the resin 5 over the entire periphery thereof.

After the cutting step, an external terminals such as solder balls 7 are provided, as shown in FIG. 1E, as required.

FIG. 2 is a cross-sectional view showing construction in the vicinity of the solder ball 7 in enlarged fashion. A conductor pattern 15 is previously formed at the position where the bump 2 is joined on a surface, on the side of the semiconductor chip C, of the board 1. The board 1 is provided with a hole 16 for exposing the conductor pattern 15 in a predetermined position on its surface on the opposite side of the conductor pattern 15. A conductor pattern 17 is formed on an inner wall of the hole 16 and in the vicinity of an edge of the hole 16 on the surface, on the opposite side of the conductor pattern 15, of the board 1. The conductor patterns 15 and 17 can be formed by copper electroplating, for example.

The solder ball 7 is transferred to the position of the hole 16 by printing on a back surface of the board 1. A part of a solder composing the solder ball 7 enters the hole 16 by subjecting the board 1 to a reflow process, as required, and is joined to the conductor patterns 15 and 17. In such a manner, a semiconductor device of a ball grid array (BGA) type, as shown in FIG. 1E, is obtained.

The conductor pattern 17 formed from the inner wall of the hole 16 to the back surface of the board 1 can be omitted. A good solder ball 7 joined to the conductor pattern 15 can be formed without the conductive pattern 17.

It goes without saying that the semiconductor device of a land grid array (LGA) type having no external terminal may be taken as a complete product, as shown in FIG. 1D.

As described in the foregoing, according to the present embodiment, the semiconductor chips C are diced from a thick wafer. Thereafter, the thick semiconductor chips C are mounted on the board 1, are further sealed with resin, and are then ground, to thin the semiconductor chips C. Consequently, the semiconductor chips C may not be cracked or chipped at the time of dicing, or may not be cracked or chipped at the time of handling. Individual pieces of semiconductor devices are cut out in a state where the thin semiconductor chips C are protected by the resin 5. Accordingly, the semiconductor chips C are not damaged in the cutting step.

Furthermore, in the semiconductor device finally obtained, the entire periphery of the sidewall of the semiconductor chip C is covered with the resin 5. Further, the inactive surface 13 of the semiconductor chip C and the resin 5 are flush with each other, so that the corners of the semiconductor chip C are not exposed. Even at the time of later handling, therefore, the semiconductor chip C can be protected by the resin 5. A significantly thin semiconductor device can be thus produced without cracking or chipping the semiconductor chip C.

The inactive surface 13 of the semiconductor chip C is exposed. However, the active surface 11 of the semiconductor chip C is opposite to the board 1, and the sidewall of the semiconductor chip C is covered with the resin 5. Accordingly, an active surface layer region of the semiconductor chip C is sufficiently protected.

FIGS. 3A to 3E are cross-sectional views showing the steps of assembling a semiconductor device according to a second embodiment of the present invention. In FIGS. 3A to 3E, portions corresponding to the portions shown in FIGS. 1A to 1E are assigned the same reference numerals.

In the above-mentioned first embodiment, the plurality of semiconductor chips C are collectively resin-molded (see FIG. 1A). Contrary to this, in the second embodiment, semiconductor chips C are individually resin-molded using a metal mold 20 having a plurality of cavities 21 formed therein that correspond to the semiconductor chips C (FIGS. 3A and 3B). In this case, cutting lines D are set at positions between individual molded resins 5. Consequently, the resin 5 is not cut, and only a board 1 is cut.

After the resin molding step, a grinding step is carried out prior to cutting the board 1 after the resin is cured (FIG. 3C). That is, the resin 5 and an inactive surface 13 of the semiconductor chip C are ground to a target grinding thickness T using a grinder or the like (see FIG. 3B).

Individual pieces of semiconductor devices which have been cut out in a cutting step (FIG. 3D) are subjected to an external terminal forming step (FIG. 3E), as required. For example, external terminals such as solder balls 7 are provided.

FIGS. 4A and 4B are cross-sectional views showing the steps of assembling a semiconductor device according to a third embodiment of the present invention. In FIGS. 4A and 4B, portions corresponding to the portions shown in FIGS. 1A to 1E are assigned the same reference numerals.

Also in the present embodiment, semiconductor chips C are individually sealed with resin, as in the second embodiment shown in FIGS. 3A to 3E. In the present embodiment, liquid resin 5 having a relatively high viscosity is dropped at a position of each of the semiconductor chips C and is cured, thereby sealing the semiconductor chip C with the resin 5. That is, the resin sealing step is achieved without using a metal mold (FIG. 4A).

After the resin sealing, the resin 5 and the semiconductor chip C are simultaneously ground to a target grinding thickness T (see FIG. 4A) using a grinder or the like, as shown in FIG. 4B, after the resin 5 is cured.

The subsequent steps are the same as those shown in FIGS. 3D to 3E.

FIGS. 5A and 5B are cross-sectional views showing the steps of assembling a semiconductor device according to a fourth embodiment of the present invention. In FIGS. 5A and 5B, portions corresponding to the portions shown in FIGS. 4A and 4B are assigned the same reference numerals.

In the present embodiment, in a resin sealing step (FIG. 5A), liquid resin 5 is made to adhere to only a sidewall 12 of a semiconductor chip C and is cured. In a later grinding step (FIG. 5B), when the resin 5 and an inactive surface 13 of the semiconductor chip C are simultaneously ground, therefore, the amount of grinding of the resin 5 is reduced, thereby making it possible to shorten time required for the grinding step.

The first to fourth embodiments are common in that at least the sidewall of the semiconductor chip C is sealed with the resin 5 over the entire periphery thereof, and the resin 5 and the inactive surface 13 of the semiconductor chip C are simultaneously ground. Consequently, in the obtained semiconductor device, the semiconductor chip C and a surface 5a of the resin 5 covering the sidewall 12 of the semiconductor chip C over the entire periphery thereof are flush with each other.

FIGS. 6A to 6C are cross-sectional views showing the steps of assembling a semiconductor device according to a fifth embodiment of the present invention. In FIGS. 6A to 6C, portions corresponding to the portions shown in FIGS. 1A to 1E are assigned the same reference numerals, and hence, the description thereof is not repeated.

In the present embodiment, a semiconductor device having a so-called chip-on-chip structure is assembled. That is, mother chips or primary semiconductor chips Cm to be the base are die-bonded to a board 1 composed of polyimide or the like. That is, the primary semiconductor chip Cm is joined to the board 1 with its inactive surface 32 opposed to the board 1. A predetermined number of (one or a plurality of) daughter chips or secondary semiconductor chips Cd are joined to an active surface 31 of the primary semiconductor chip Cm by face-down bonding. That is, the secondary semiconductor chip Cd is joined to the primary semiconductor chip Cm in a state where its active surface 11 is opposite to the active surface 31 of the primary semiconductor chip Cm.

More specifically, the primary semiconductor chip Cm and the secondary semiconductor chip Cd respectively have pads for connecting chips (not shown). The pads for connecting chips are connected to each other by bumps 2 composed of an oxidation resistant metal such as gold. The bump 2 can join the primary semiconductor chip Cm and the secondary semiconductor chip Cd to each other if it is provided in at least one of the chips Cm and Cd.

The active surface 31 of the primary semiconductor chip Cm has pads for external connection Pe provided at a position close to its edge. The pads Pe are connected to a wiring pattern 33 formed on the board 1 by bonding wires 35.

In a state where the secondary semiconductor chip Cd is joined to the primary semiconductor chip Cm joined to the board 1, and the primary semiconductor chip Cm and the board 1 are further connected to each other by wire bonding, the semiconductor device having a chip-on-chip structure is sealed with resin 5. A state where the semiconductor device is sealed with the resin 5 is illustrated in FIG. 6A.

After the resin sealing step, the resin 5 is ground by a grinder after the resin 5 is cured, so that an inactive surface 13 of the secondary semiconductor chip Cd is exposed. Thereafter, the resin 5 and the inactive surface 13 of the semiconductor chip Cd are further simultaneously ground. The resin 5 and the secondary semiconductor chip C are thus ground to a target grinding thickness T set such that they do not reach the bonding wire 35 (FIG. 6B).

Individual pieces of semiconductor devices each having a chip-on-chip structure are then cut out along cutting lines D by using a dicing saw, for example (FIG. 6C). Thereafter, an external terminal forming step for connecting external terminals such as solder balls 7 to a lower surface (a surface on the opposite side of a surface where the board 1 is joined to the primary semiconductor chip Cm) of the board 1 is carried out, as required. Construction in the vicinity of the solder ball 7 is almost the same as that shown in FIG. 2.

In the present embodiment, the secondary semiconductor chip Cd is thus sealed with the resin 5, and the resin 5 and the inactive surface 13 of the secondary semiconductor chip Cd are then simultaneously ground. Consequently, it is possible to obtain a semiconductor device in a state where a sidewall 12 of the secondary semiconductor chip Cd is covered with the sealing resin 5 having a surface 5a which is flush with the inactive surface 13 of the secondary semiconductor chip Cd over the entire periphery thereof. In the present embodiment, a plurality of secondary semiconductor chips Cd which are mounted on the primary semiconductor chip Cm are together ground. Therefore, it is possible to make the heights of the secondary semiconductor chips Cd equal to each other.

Even in assembling the semiconductor device having a chip-on-chip structure in the present embodiment, the resin sealing method shown in FIGS. 3A to 3E, FIGS. 4A and 4B, or FIGS. 5A and 5B can be applied.

FIGS. 7A to 7D are cross-sectional views showing the steps of assembling a semiconductor device according to a sixth embodiment of the present invention. In FIGS. 7A to 7D, portions corresponding to the portions shown in FIGS. 1A to 1E are assigned the same reference numerals.

In the present embodiment, a lead frame 50 which is one form of a board is used. The lead frame 50 has an island portion 51 on which a semiconductor chip C is to be mounted and a lead portion 52 (an external connecting terminal) for external connection. In a chip joining step shown in FIG. 7A, the semiconductor chip C is die-bonded to the island portion 51. In this case, an inactive surface 13 of the semiconductor chip C is opposed to the island portion 51. Thereafter, pads (not shown) provided on an active surface 11 of the semiconductor chip C and the lead portion 52 are connected to each other by bonding wires 55.

As shown in FIG. 7D, the surface of the lead portion 52 of the lead frame 50 on the side toward the semiconductor chip C has a portion that is aligned with the active surface of the semiconductor chip C. Because these surfaces are both planar and are aligned as shown in FIG. 7D, they also lie in the same plane.

In this state, the semiconductor chip C is sealed with resin 5, as shown in FIG. 7B (illustrated with FIG. 7A turned upside down). In this case, the sealing resin 5 together seals a sidewall 12 of the semiconductor chip C, the active surface 11, and the bonding wire 55 so that a part of the lead portion 52 of the lead frame 50 is exposed to the outside.

A grinding step shown in FIG. 7C is then carried out. That is, grinding is performed to a target grinding thickness T shown in FIG. 7B by using a grinder. In the early stages of the grinding step, only the resin 5 is ground. The resin 5 and the island portion 51 (a portion opposite to the inactive surface 13 of the semiconductor chip C) of the lead frame 50 are then simultaneously ground. The resin 5, the lead frame 50, and the inactive surface 13 of the semiconductor chip C are then simultaneously ground. In such a manner, the resin 5 covers the sidewall 12 of the semiconductor chip C, and has a surface 5a which is flush with the inactive surface 13 of the semiconductor chip C.

Thereafter, a cutting step for cutting the resin 5 and the lead frame 50 is carried out along cutting lines D shown in FIG. 7C by using a dicing saw, for example. Accordingly, individual pieces of semiconductor devices shown in FIG. 7D are obtained.

According to the present embodiment, a thinned semiconductor device having a lead frame as an external connecting terminal can be thus produced without cracking and chipping the semiconductor chip.

FIGS. 8A to 8D are cross-sectional views showing the steps of assembling a semiconductor device according to a seventh embodiment of the present invention. In FIGS. 8A to 8D, portions corresponding to the portions shown in FIGS. 1A to 1E are assigned the same reference numerals.

The present embodiment is characterized in that the step of sealing the semiconductor chips C with the resin 5 (see FIGS. 1A to 1E) is omitted.

Specifically, each of a plurality of semiconductor chips C are joined to a board 1 through bumps 2 in a state where its active surface 11 which is a surface on the side of an active surface layer area where devices such as transistors and resistors are formed is opposite to the board 1 (that is, by face-down bonding), and is electrically connected to a wiring pattern formed on the board 1.

After the semiconductor chips C are joined to the board 1, liquid resin 3 (underfill) is injected into a clearance between the active surface 11 and the board 1. Consequently, the devices formed in the surface layer area on the side of the active surface 11 are protected.

An inactive surface 13 of each of the plurality of semiconductor chips C on the board 1 is subjected to a grinding step in a state where the semiconductor chip C is not sealed with resin. Studies conducted by the inventors of the present application prove that the grinding step for the inactive surface 13 can be carried out without causing problems even if the semiconductor chip C is not sealed with resin.

In the grinding step, the inactive surface 13 of the semiconductor chip C is ground to a target grinding thickness T indicated by a two-dot and dash line in FIG. 8A using a grinder. The target grinding thickness T is so set that the thickness t of the semiconductor chip C after the grinding is approximately 100 to 200 μm, for example.

The board 1 is then cut along cutting lines D set between the semiconductor chips C using a dicing saw, for example. Accordingly, individual pieces of semiconductor devices are cut out, as shown in FIG. 8C.

Thereafter, solder balls 7 are formed on a surface, on the opposite side of the semiconductor chip C, of the board 1, as shown in FIG. 8D, as required. In the final shape, the semiconductor chip C need not be sealed with resin on the side of not only the inactive surface 13 but also its sidewall 12.

According to the present embodiment, the semiconductor chip C need not be thus sealed with resin, so that the steps of producing the semiconductor device can be significantly simplified. Consequently, it is possible to reduce the production cost as well as to significantly improve the productivity.

Although description has been made of the seven embodiments of the present invention, the present invention can be embodied even in other embodiments. Although in the above-mentioned second, third or fourth embodiment, for example, the semiconductor chips C are individually resin-molded, the semiconductor chips C may be divided into groups each comprising two or three semiconductor chips (i.e., a predetermined number of semiconductor chips), to collectively resin-mold the plurality of semiconductor chips in each of the groups.

In the steps in the second, third, or fourth embodiment, the board 1 juts out from the sealing resin 5, as indicated by reference numeral 60 in FIG. 3D. This does not cause a large problem. If this causes a problem, the cutting line D1 (see FIG. 3C) may be set so as to pass through the resin 5, to cut the resin 5 and the board 1 along the cutting line D1.

Furthermore, although in each of the above-mentioned embodiments, mechanical grinding is performed using the grinder in the grinding step, the grinding step may be a chemical grinding or polishing step using an etching liquid, or may be a chemical-mechanical grinding step such as CMP (Chemical-Mechanical Polishing). In grinding or polishing the inactive surface of the semiconductor chip, the grinding speed is thought more important than the grinding precision. Therefore, the mechanical grinding method using the grinder is the most desirable out of the above-mentioned three methods from the viewpoint of improvement in production efficiency.

The resin and the inactive surface of the semiconductor chip which have been subjected to the mechanical grinding using the grinder have a continuous cutting trace. The cutting trace can be deleted by a chemical method such as etching, as required.

Although in the above-mentioned embodiment, the dicing saw is used in the cutting step for cutting out the individual pieces of semiconductor devices, another cutting method such as cutting using a laser beam, for example, may be employed.

Although the present invention has been described and illustrated in detail, it is clearly understood that the same is by way of limitation, the spirit and scope of the present invention being limited only by the terms of the appended claims.

This application claims priority benefits under 35 USC § 119 of Japanese Patent Application Serial No. 11-160066 filed with the Japanese Patent Office on Jun. 7, 1999, and No. 11-245854 filed with the Japanese Patent Office on Aug. 31, 1999, the disclosures of which are incorporated herein by reference.

What is claimed is:

1. A semiconductor device, comprising:
   a semiconductor chip having an active surface and an inactive surface disposed opposite the active surface;
   a lead frame having an exposed portion for external connection;
   a bonding wire connecting the active surface of the semiconductor chip and the lead frame; and
   a protective resin covering a sidewall of the semiconductor chip, the lead frame and the bonding wire, the inactive surface for the semiconductor chip being exposed to the outside of the protective resin, the exposed portion of the lead frame being exposed to the outside of the protective resin, the protective resin having a first surface formed so as to be flush with the inactive surface of the semiconductor chip and a second surface, opposite the first surface, formed so as to be flush with a surface of the exposed portion of the lead frame;
   wherein the semiconductor chip and the lead frame are separated from each other; and
   wherein the semiconductor chip and the lead frame do not overlap each other as seen from a direction perpendicular to the inactive surface;
   wherein the semiconductor chip is thinned;
   wherein the surface of the lead frame on the semiconductor chip side has a portion that is aligned with the active surface of the semiconductor chip.

2. The semiconductor device of claim 1, wherein the semiconductor chip and the lead frame are separated from each other by the protective resin.

3. The semiconductor device of claim 1, wherein the surface of the lead frame on the semiconductor chip side has a portion that is in a same plane as the active surface of the semiconductor chip.

4. The semiconductor device of claim 1, wherein the semiconductor chip is thinned by grinding or polishing.

* * * * *